United States Patent
Desgrez et al.

(10) Patent No.: US 6,753,704 B2
(45) Date of Patent: Jun. 22, 2004

(54) SAMPLING PHASE DETECTOR

(75) Inventors: Simon Desgrez, Toulouse (FR); Dominique Langrez, Lavernose Lacasse (FR)

(73) Assignee: Alcatel, Paris (FR)

( * ) Notice: Subject to any disclaimer, the term of this patent is extended or adjusted under 35 U.S.C. 154(b) by 37 days.

(21) Appl. No.: 10/303,745

(22) Filed: Nov. 26, 2002

(65) Prior Publication Data

US 2003/0132784 A1 Jul. 17, 2003

(30) Foreign Application Priority Data

Nov. 29, 2001 (FR) .............................. 01 15429

(51) Int. Cl.$^7$ .................. G01R 25/00; G11C 27/02
(52) U.S. Cl. .............................. 327/9; 327/91
(58) Field of Search .................. 327/7–10, 91, 327/93, 94, 374–377, 427, 434, 437, 440; 341/122

(56) References Cited

U.S. PATENT DOCUMENTS

| | | |
|---|---|---|
| 4,323,796 A | 4/1982 | Lathrope |
| 5,017,924 A | 5/1991 | Guiberteau et al. |
| 5,187,390 A | 2/1993 | Scott, III |
| 5,339,459 A | 8/1994 | Schiltz et al. |

OTHER PUBLICATIONS

T. Sowlati: "Phase Correcting Feedback System for Class E Power Amplifier" IEEE Journal of Solid State Circuits, vol. 32, No. 4, Apr. 1, 1997 pp. 544–550, XP000659735, New York, US.

M. Bruun: "A 2–10 GHZ MMIC Opto–Electronic Phase Detector for Optical Microwave Signal Generators" IEEE MTT–S Digest, May 23, 1994, pp. 499–502, XP00527324, New York, US.

Primary Examiner—My-Trang Nuton
(74) Attorney, Agent, or Firm—Sughrue Mion, PLLC

(57) ABSTRACT

The invention proposes a sampling phase detector in which a first sampling transistor with a very high sensitivity determines the phase of a signal to be sampled. A signal representative of the phase is supplied to a second sampling stage. The second sampling stage retains the phase value determined in this way. The invention provides a phase signal that is more stable and more sensitive. The invention also provides a method and an oscillator employing the method.

14 Claims, 5 Drawing Sheets

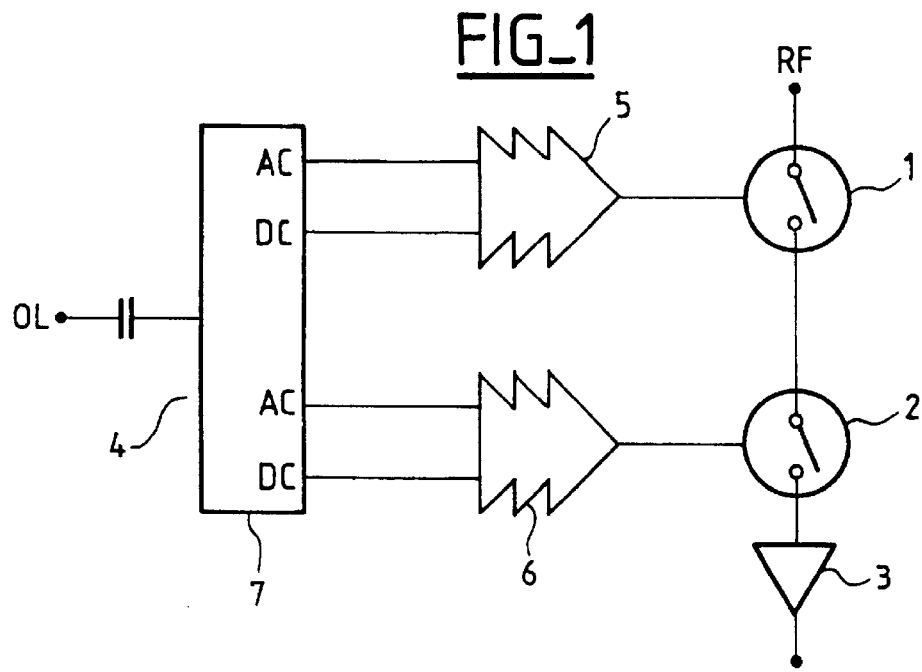
FIG_1
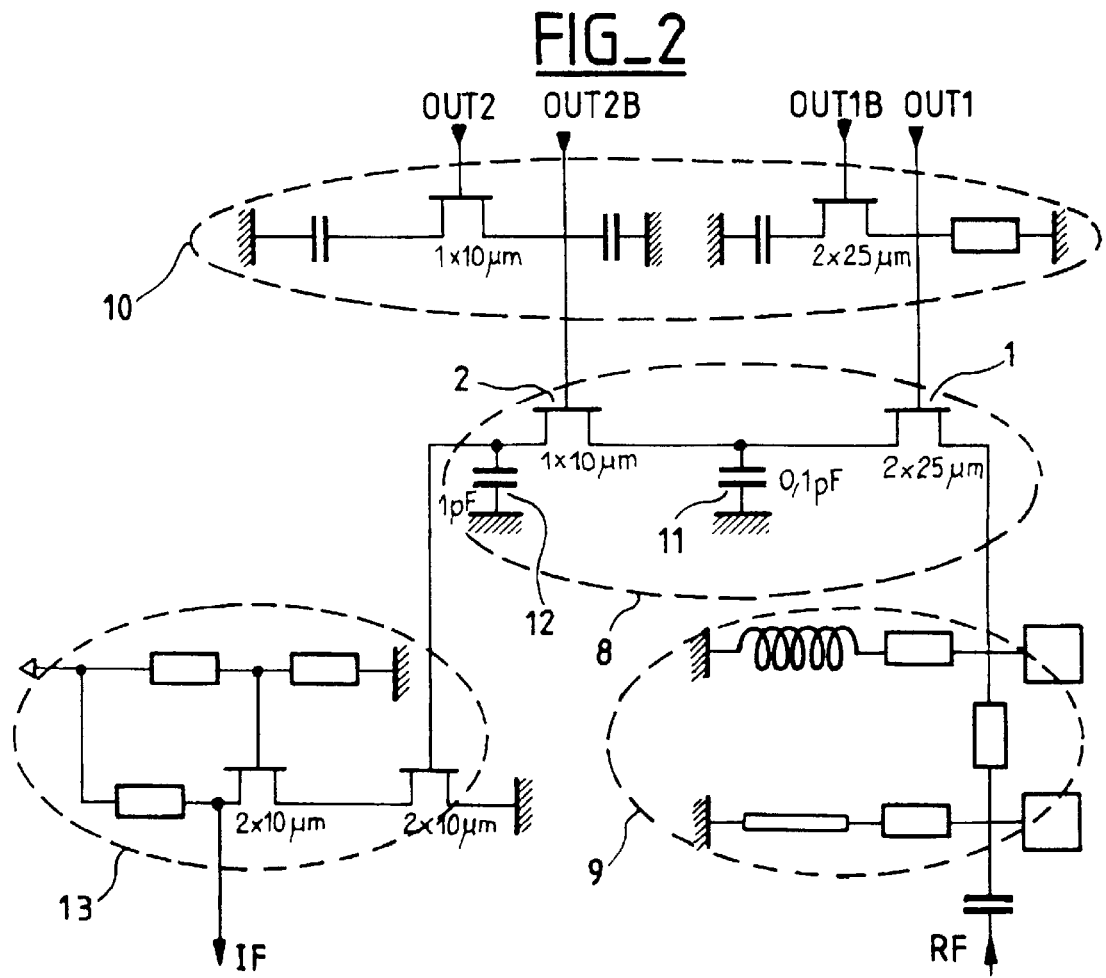
FIG_2

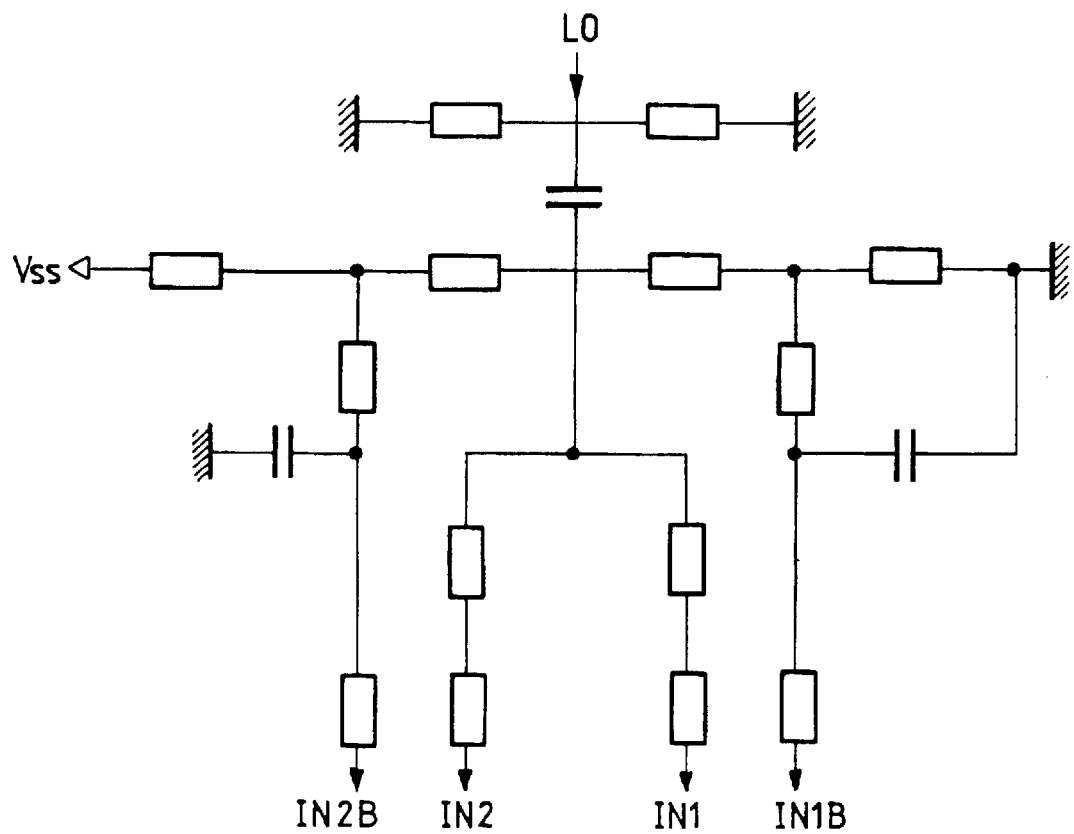
FIG_3
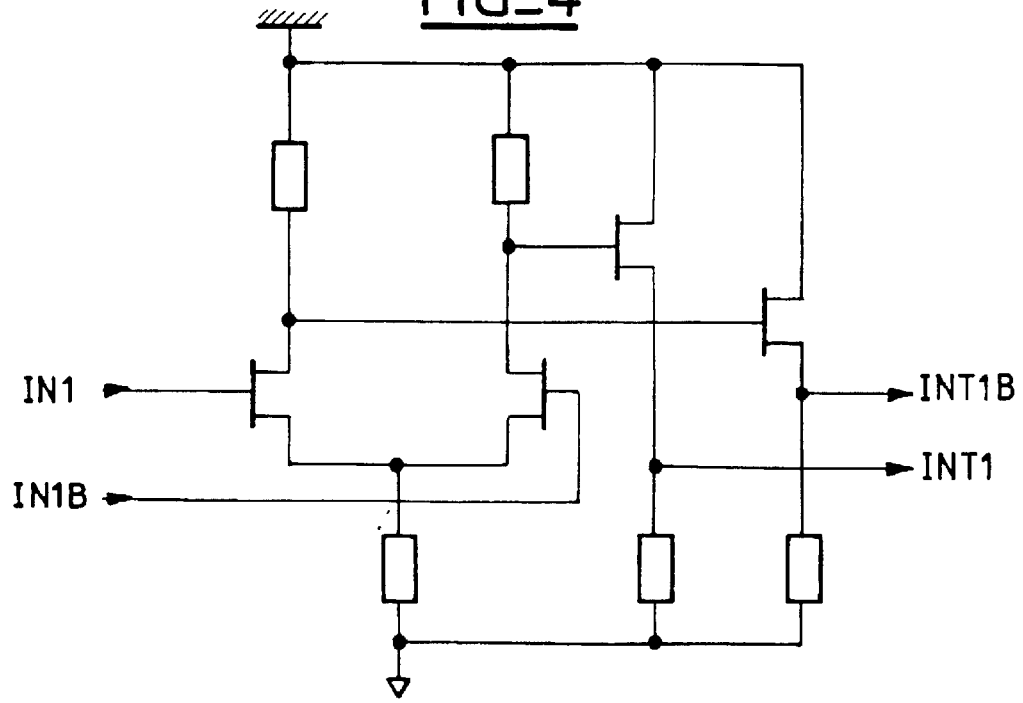
FIG_4

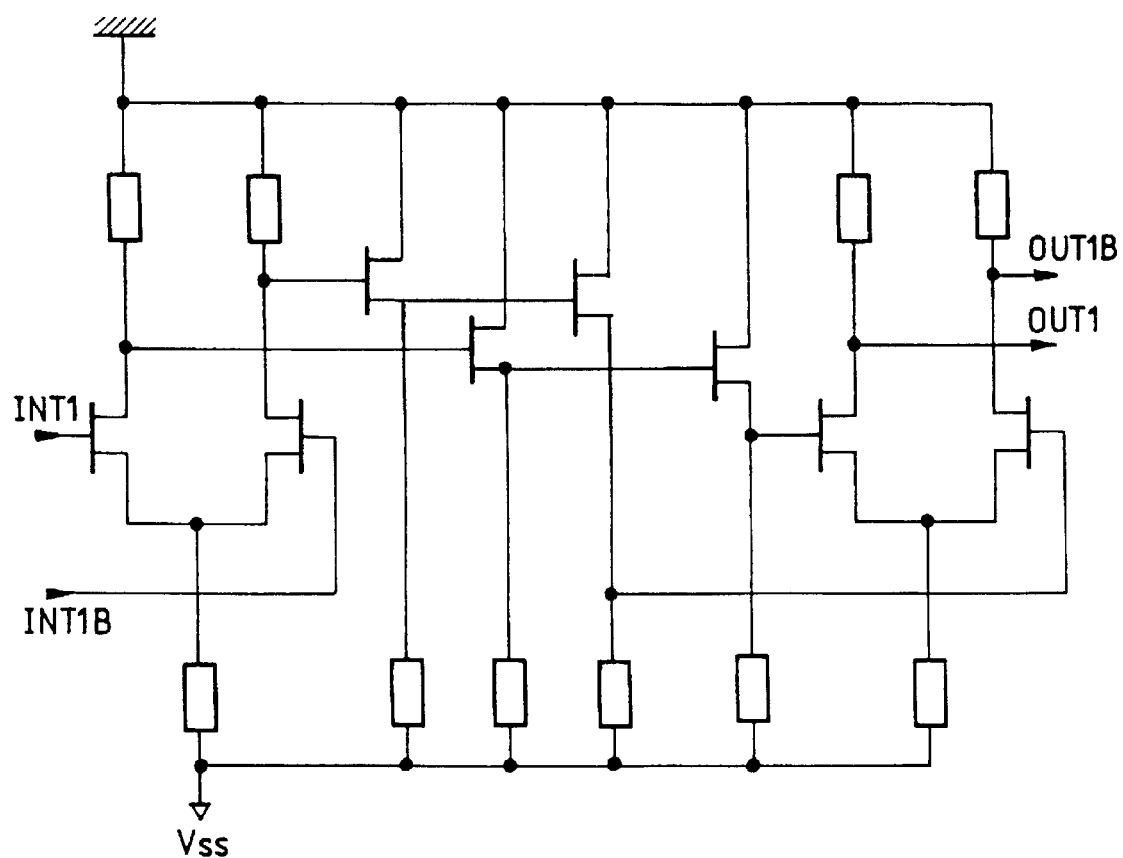
FIG_5

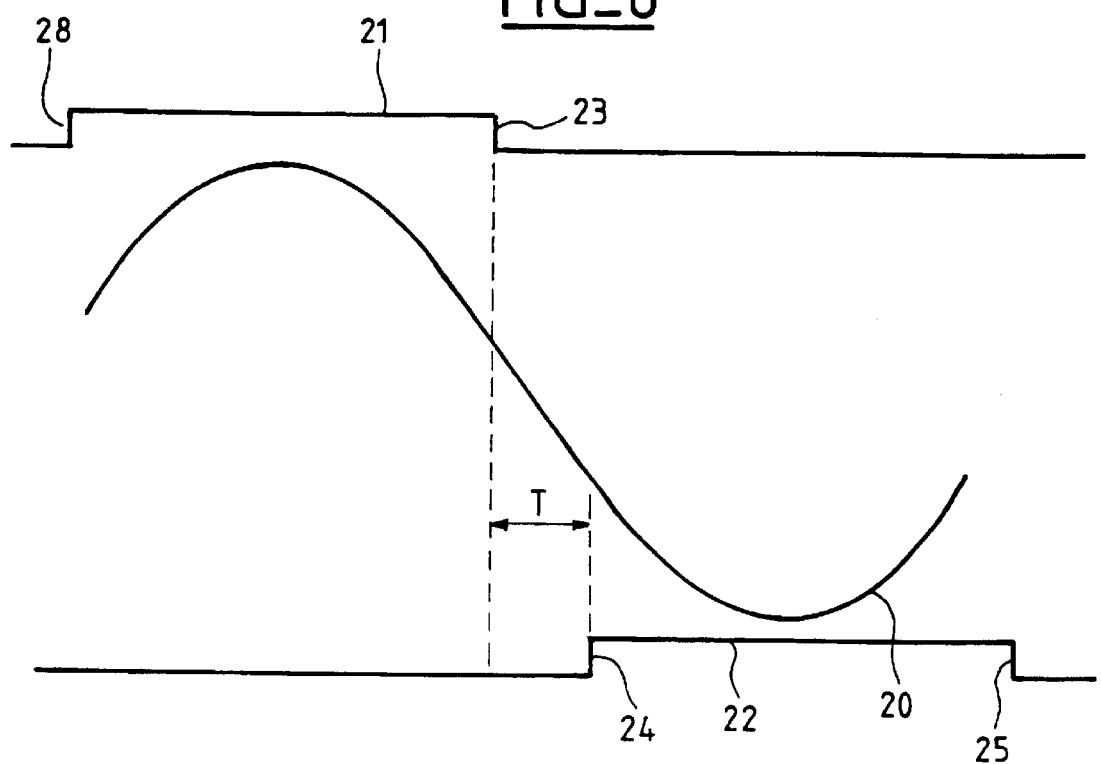
FIG_6
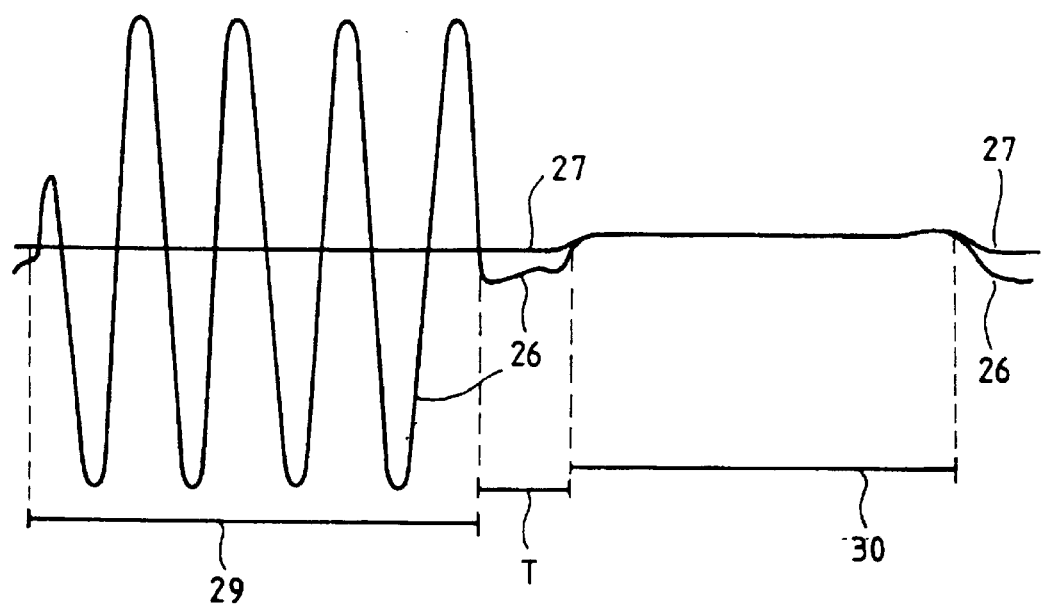
FIG_7

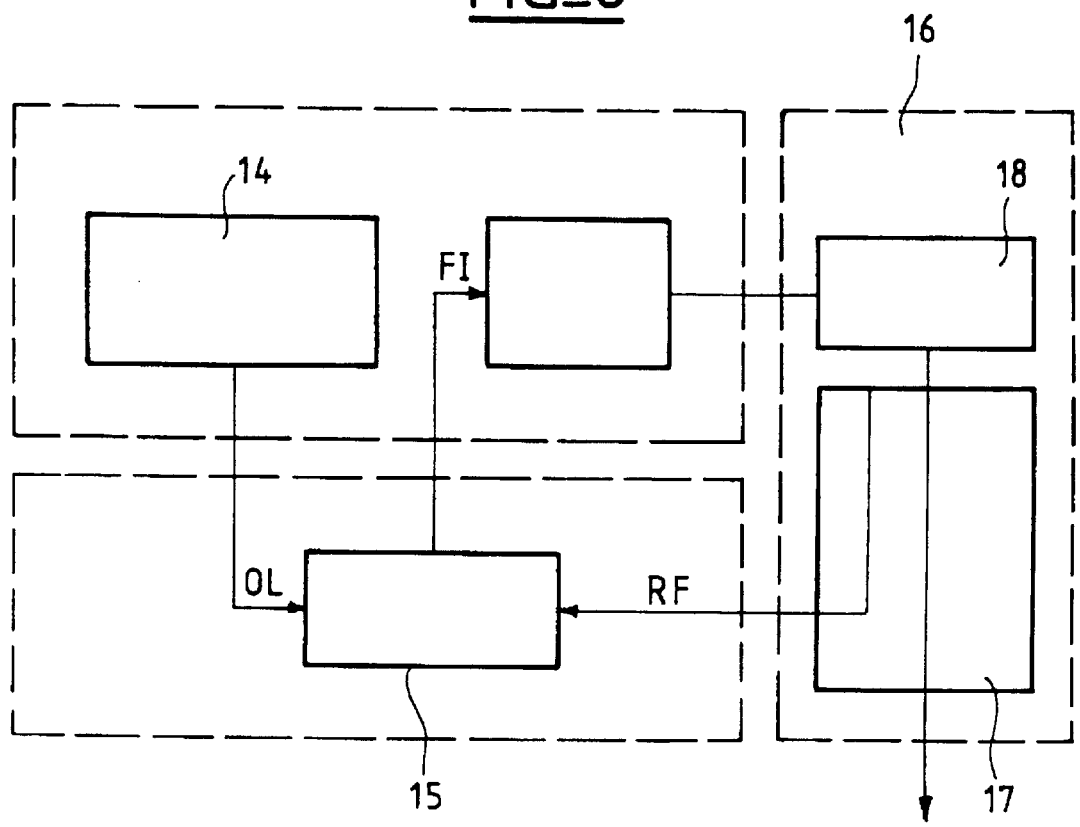
FIG_8

SAMPLING PHASE DETECTOR

FIELD OF THE INVENTION

The present invention relates to phase detectors and in particular to sampling phase detectors.

BACKGROUND OF THE INVENTION

Microwave & RF, Jul. 1993, pages 103 to 111, describes a hybrid circuit sampling phase detector. The detector includes a step recovery diode (SRD) and a sampling circuit. During a change of polarity at its terminals the diode conducts and supplies an impulse which constitutes a low-frequency reference to an input of a sampling circuit which also receives a high-frequency or radio-frequency signal to be sampled. The frequency of the signal to be sampled is N times higher than the frequency of the reference impulses, where N is an integer. The sampling circuit compares the impulse signal to the signal to be sampled. When the rising edge of the impulse reaches a level that is equal to the level of the signal to be sampled, a corresponding constant voltage level is supplied at the output of the sampling circuit. An output voltage proportional to the phase of the radio-frequency signal relative to a reference signal is therefore obtained. The sampling circuit includes a sampling transistor having a gate of intermediate width which represents a compromise between good phase sensitivity and a good DC output signal from the sampling circuit.

The above sampling phase detector has drawbacks. Firstly, the hybrid circuit implies a large overall size. Secondly, to generate adequate impulses, the SRD needs a high-power supply. These drawbacks are a particular handicap in aerospace applications. Also, this type of circuit requires many adjustments prior to use and its unit cost is high.

The document WO-A-99/18691 describes a totally digital phase comparator which indicates the phase between two clock signals. A radio-frequency analog signal is digitized and its digital approximation is compared to a digital model. The phase difference between the digital signals is then coded as a function of its amplitude in the form of a digital word.

Patent Abstract of Japan JP-0214009, "Sampling phase detector", describes a sampling phase detector in the form of a monolithic integrated circuit which is produced on a Ga—As substrate and uses a field-effect transistor which is switched by amplitude limiting circuits, a delay circuit and an AND gate. Two signals are combined in a NOR gate to generate an impulse at a reference frequency.

The above sampling circuit has drawbacks. The field-effect transistor used has too low a resistance when it is turned off and too high a resistance when it is turned on. The phase sensitivity and stability of the output signal are therefore inadequate.

There is therefore a need for a sampling phase detector resolving one or more of the above drawbacks and there is also a need for a local oscillator including a phase detector as claimed herein.

SUMMARY OF THE INVENTION

The invention therefore proposes a sampling phase detector comprising a first sampling transistor having an input for a signal to be sampled at a frequency RF, an input for a control signal, an output for supplying a first sampled signal as a function of the phase between the signal to be sampled and the control signal, and a resistance between the input and the output when it is turned on less than $(0.1 \times 10^{-12} \times RF)^{-1}$, and a second sampling transistor having a resistance between the input and the output when it is turned off greater than 100 ohms and having an input to which the first sampled signal is applied, an input for a control signal, and an output for a second sampled signal.

In an embodiment, the sampling transistors are field-effect transistors, the drain of the first transistor is the input for the signal to be sampled, the gate of the first transistor is the input for a control signal, the source of the first transistor is the output for the sampled signal, the drain of the second transistor is the input for the first sampled signal, the gate of the second transistor is the input for the control signal, the source of the second transistor is the output for the second sampled signal, and the resistance between the input and the output of the second transistor when it is turned off is greater than the resistance between the input and the output of the first transistor when it is turned off.

In an embodiment the source of the first transistor is shunted by a first capacitor and the source of the second transistor is shunted by a second capacitor.

In an embodiment the detector further comprises a control signal generator for supplying pulses to the inputs for control signals of the first and second transistors.

In an embodiment the control signal generator is implemented monolithically with the transistors.

The control signal generator can have an input for an AC reference signal and an inverter circuit for connecting the AC reference signal input to the input for a control signal of the first or second transistor.

In an embodiment the inverter circuit includes an SCFL gate.

In an embodiment the inverter circuit comprises three or four inverter stages.

In an embodiment the control signal generator supplies respective control signals in phase opposition to the first and second transistors.

The invention also provides a local oscillator including a phase detector as claimed herein.

The invention further provides a sampling phase detection method comprising the steps of providing a first sampling transistor having a resistance between its input and its output less than $(0.1 \times 10^{-12} \times RF)^{-1}$ when it is turned on, providing a second sampling transistor having a resistance between its input and its output greater than 100 ohms when it is turned off, sampling the signal to be sampled in the first sampling transistor, and sampling the sampled signal in the second sampling transistor.

In an implementation the method further comprises the step of applying control pulses to the transistors to trigger the sampling steps.

In an implementation the control pulses are in phase opposition.

In an implementation the method further comprises a step of smoothing the sampled signals.

DETAILED DESCRIPTION OF THE PREFERRED EMBODIMENTS

Other features and advantages of the invention will become apparent on reading the following description of embodiments of the invention, which description is given by way of example and with reference to the accompanying drawings, in which:

FIG. 1 is a diagrammatic representation of a sampling phase detector according to the invention;

FIG. 2 shows the structure of a sampling unit and associated units;

FIG. 3 shows an input interface circuit of a control signal generator;

FIG. 4 shows one example of a first type of inverter stage;

FIG. 5 shows one example of a second type of inverter stage;

FIG. 6 shows a reference signal and two control signals in phase opposition;

FIG. 7 shows signals at the outputs of respective sampling transistors; and

FIG. 8 shows one example of an oscillator using a phase detector according to the invention.

The invention proposes a sampling phase detector in which a very high sensitivity first sampling transistor determines the phase of a signal to be sampled. A signal representing the phase is supplied to a second sampling stage. The second sampling stage retains the phase value that has been determined and isolates the output.

FIG. 1 is a diagrammatic representation of a phase detector according to the invention, which has an input for a reference signal OL and an input for a signal RF to be sampled and provides at its output a signal representative of the phase between the reference signal and the signal to be sampled.

The phase detector includes a control signal generator 4 and two sampling transistors 1 and 2. An input of the control signal generator 4 receives the reference signal OL, which is converted into appropriate control signals in respective inverters 5 and 6. The control signals have the same frequency as the reference signal OL, for example a frequency from 50 to 100 MHz. The inverters 5 and 6 supply respective control signals to respective control signal inputs of the transistors 1 and 2.

Although the transistors 1 and 2 shown are field-effect transistors (FET), bipolar transistors or any other suitable type of transistor can of course be used. Using FETs has a number of advantages. FETs have very short switching times and very low electrical power consumption. Bipolar transistors can nevertheless be used to sample a signal of higher frequency.

To a first approximation, a sampling circuit transistor behaves as a variable resistance. When an FET is turned off, the drain-source resistance takes a value Roff which is inversely proportional to the width or size of the gate, and vice-versa for the transistor when turned on, the drain-source resistance taking a value Ron. The widths or sizes of the gates of the transistors can therefore be altered to adapt the on and off resistances to the required levels.

A transistor 1 is preferably used that has a drain-source resistance when it is turned on below a predetermined level defined by the following formula, for example, in which RE is the frequency of the signal to be sampled:

$$R_{ON}T1 < (0.1 \times 10^{-12} \times RF)^{-1}$$

Defining the maximum resistance by the following formula can also be envisaged:

$$R_{ON}T1 < (1 \times 10^{-12} \times RF)^{-1}$$

Using a resistance value as defined above means that the signal can be sampled with low attenuation, which increases the sensitivity of the sampling circuit. Furthermore, the resistance of the transistor 1 when it is turned on is inversely proportional to the frequency of the signal to be sampled.

The minimum resistance when turned on is preferably defined by the following formula:

$$R_{ON}T1 > (100 \times 10^{-12} \times RF)^{-1}$$

The transistor 1 has an input for the radio-frequency signal RF to be sampled connected to its drain. The frequency of the signal to be sampled is N times greater than the frequency of the control signals, where N is an integer. The frequency of the signal to be sampled is from 1 to 20 GHz, for example.

The control signal for the transistor 1 is applied to its gate. If the voltage of the control signal is above its gate voltage threshold, the transistor 1 is turned on and then provides a DC first sampled signal at its output, i.e. at its source. This first sampled signal is representative of the phase difference between the control signal and the signal RF to be sampled.

The source of the transistor 1 is connected to the drain of the transistor 2, for example, so that the first sampled signal can be fed to an input of the second transistor 2. The control signal for the transistor 2 is applied to its gate. If the control signal voltage is above its gate voltage threshold, the transistor 2 is turned on. The transistor 2 then provides a substantially DC second sampled signal at its output, i.e. at its source. The second sampled signal is representative of the phase difference between the reference signal and the signal RF to be sampled.

A transistor 2 having a drain-source resistance when it is turned off greater than 100 ohms, and more particularly greater than 500 ohms, is preferably used. These resistance values improve the stability and retention of the second sampled signal. A value of 1000 ohms can also be envisaged. For example, a resistance when turned off of 2500 ohms is used in the example. A transistor 2 having a drain-source resistance greater than 100 ohms when it is turned on is preferably used to filter potential interference caused by the radio-frequency signal to be sampled. Thus the second sampled signal is neither interfered with nor influenced by the signal to be sampled.

The unit 8 in FIG. 2 represents one embodiment of a sampling circuit, which can include a capacitor 11 shunting the source of the transistor 1. A capacitor 12 can shunt the source of the transistor 2. To decide the values of the capacitors 11 and 12, account is of course taken of the drain-source resistances of the respective transistors 1 when turned on. In this way the resistance when turned on/off and the capacitance are adapted to provide a required time constant for a transistor-capacitor combination.

A time constant for the transistor 1 when turned on suited to the frequency of the signal to be sampled is used for the combination consisting of the transistor 1 and the capacitor 11.

The capacitors 11 and 12 can be replaced by components providing the same smoothing and retention function, such as appropriately integrated transistors or diodes.

The capacitance of the capacitor 11 is adapted to achieve good voltage stability of the first sampled signal. This capacitance of this capacitor is also adapted to sampling a signal at a high frequency with good phase sensitivity. A 0.1 pF capacitor is used in the example.

The capacitance of the capacitor 12 is adapted to achieve excellent voltage stability of the DC second sampled signal. The capacitance of this capacitor is preferably also adapted to provide an adequate sampling time. A 1 pF capacitor is used in the example.

The generation and use of the control signals is described next. The signal generator 4 supplies control signals in the form of impulses to the first and second transistors 1 and 2. It has previously been assumed that a very short impulse is indispensable for good phase sensitivity. The inventor has shown that it is not essential to use control signals in the form of impulses to achieve satisfactory sampling. The inventor proposes instead to use a pulse having a falling edge with a very short switching time. Circuits for generating pulses are simpler and less costly than circuits for generating impulses. A circuit for generating control signals with short switching times is described next.

The control signal generator 4 can have an input interface 7 such as that shown in FIG. 3. This circuit receives at its input an AC reference signal OL, which is usually sinusoidal, and supplies at its output four signals IN1, IN1B, IN2 and IN2B. The signals IN1 and IN2 are AC signals which have a DC component. The amplitude of the DC component is adapted to the levels required by logic gates included in the inverters. The signals IN1B and IN2B are DC signals and provide reference signals for triggering logic gates in the inverters 5 and 6.

The inverters 5 and 6 convert the reference signal, which is a sinusoidal signal, for example, into respective control signals in the form of pulses for the transistors 1 and 2. For example, the inverters 5 and 6 connect the reference signal input to the gate of a respective transistor. Generally speaking, the inverters 5 and 6 use source-coupled field-effect transistor logic (SCFL) inverting logic gates, which have short switching times, which increases phase sensitivity, as previously described. Accordingly, satisfactory phase sensitivity can be achieved in the phase detector even for signals to be sampled at frequencies of the order of 20 GHz and above. SCFL gates also have very low electrical power consumption, which is particularly advantageous in aerospace applications. The circuit shown comprises a small number of simple logic components. This kind of circuit is relatively insensitive to radiation, which is particularly advantageous in aerospace applications.

The inverters 5 and 6 preferably consist of chained inverter stages. The greater the number of inverter stages, the shorter the control signal switching time. The number of inverter stages is also adapted as a function of the waveform of the reference signal. If the reference signal is close to a pulse, a small number of inverter stages is sufficient to obtain a given switching time. In the example four inverter stages are used to transform the reference signal into pulses. It has been found that in practice this number of inverter stages reduces switching times and electrical power consumption.

For example, the chained inverter stages comprise, in series from the reference signal input to the control signal input, three inverter stages such as those shown in FIG. 4 followed by an inverter stage such as that shown in FIG. 5. Chained inverter circuits of this kind have low phase noise and more importantly low sensitivity of the phase to radiation.

FIG. 4 shows an inverter stage receiving at its inputs the signals IN1 and IN1B. The signals pass through the inverter stage, which provides at its output the signals INT1 and INT1B. The main function of the inverter stages is to convert the reference signal into pulses. Low voltage levels can be used in the inverter stages to reduce electrical power consumption.

FIG. 5 shows a final inverter stage providing an interface with a sampling transistor. This sampling stage adapts the control signal to the type of sampling transistor to which it is fed and can also amplify signals from preceding inverter stages. It therefore provides at its outputs OUT1 and OUT1B control signals whose high and low levels conform to the requirements of the corresponding sampling transistor. The output OUT1 is connected to the transistor 1 as shown in FIG. 2, for example.

FIG. 2 further shows that the outputs OUT1B and OUT2B of the inverters 5 and 6 are connected to a load compensator circuit 10. The load compensator circuit 10 has a structure similar to the sampling circuit 8 and balances the loads of the inverters 5 and 6 of the last inverter stage. This circuit is particularly beneficial when the two transistors in the final inverter stage are balanced. This prevents an imbalance causing an increase in the switching time.

Further information regarding the control signals is given next with reference to FIG. 6. The curve 20 represents a sinusoidal reference signal supplied to the control signal generator. The curves 21 and 22 represent the pulse control signals at the outputs of the inverters 5 and 6, respectively. It can be seen that the control signals 21 and 22 are in phase opposition. It can also be seen that the high states of the control signals do not overlap, in that there is a period T between the falling edge 23 of the signal 21 and the rising edge 24 of the signal 22. Generally speaking, a rising edge of a control signal turns on the respective transistor and a falling edge of a control signal turns off the respective transistor.

These control signal characteristics are justified next with reference to FIG. 7. The signal 26 is the signal at the source of the transistor 1. The signal 27 is the signal at the source of the transistor 2. The portion of the signal 26 during the period 29 corresponds to the turned on state of the transistor 1. This portion corresponds to the period from the rising edge 28 of the control signal 21 to its falling edge 23. The signal 26 substantially corresponds to the signal to be sampled during the period 29. At this time the control signal 22 is in the low state. The transistor 2 is therefore turned off and the signal 27 is therefore a DC level.

The transistors 1 and 2 remain turned off during the period T between the falling edge of the signal 21 and the rising edge of the signal 22. At the falling edge of the signal 21 the transistor supplies at its output an instantaneous DC voltage proportional to the signal to be sampled. The signal 26 at the output of the transistor 1 is smoothed by the capacitor 11. Thus a substantially DC signal is applied to the drain of the transistor 2 during the period T, which is preferably in a ]0%; 99%[ range of the sampling period.

At the rising edge of the signal 22, the transistor 2 is turned on. It then samples the signal from the transistor 1. Because of the properties of the transistor 2 previously described, it maintains a very stable DC signal representative of the phase difference between the reference signal and the signal to be sampled at its source during the period 30, i.e. between the rising edge 24 and the falling edge 25 of the control signal 22. This phase difference signal is then smoothed by the capacitor 12 as previously described.

Because there is no overlap between the control signals 21 and 22, the transistor 2 suffers no interference caused by the signal to be sampled. The system and the method used do not need to use control impulses to obtain a precise phase difference.

A series buffer circuit 13 can additionally be provided at the output of the transistor 2 to eliminate the influence of the output impedance on the transistor 2 so that the output impedance does not influence sampling. The buffer can also have a DC gain greater than 1 to increase measurement sensitivity.

In a preferred embodiment of the invention, the control signal generator and the sampling transistors are produced monolithically. For example, they can take the form of a single circuit integrated on a Ga—As substrate. This implementation reduces the overall volume, cost and electrical power consumption of the sampling phase detector. Furthermore, implementation in the form of a monolithic integrated circuit eliminates adjustments after design and production, which facilitates the design of the detector.

A reference signal at a frequency of the order of 50 to 100 MHz can be generated by an external quartz crystal circuit, for example. Thus a precise reference signal can be generated using widely available low-cost components.

The sampling phase detector can be used in an oscillator, for example. Oscillators used as frequency sources use the phase determined by the detector, for example. Thus the phase can be fed into an oscillator frequency control loop. It is therefore possible to generate very stable frequencies using an oscillator provided with a sampling phase detector according to the invention.

FIG. 8 shows an example of an oscillator using a phase detector according to the invention. The oscillator includes a voltage-controlled oscillator (VCO) 16, a sampling phase detector 15 and a reference signal generator. A VCO usually exhibits a high level of phase noise, i.e. low frequency stability. The oscillator 16 has an output interface 17 which supplies a signal at a given frequency to an auxiliary device and to the phase detector 15. The phase detector 15 samples the received signal as a function of the reference signal. The phase detector 15 supplies the signal RF representative of the phase to a control unit 18 which corrects the generated signals via the output interface.

The above embodiments and examples are offered by way of illustrative and non-limiting example, and the invention is not limited to the details provided here and can be modified without departing from the scope of the appended claims. For example, substituting bipolar transistors controlled by appropriate currents and having particular resistances between the collector and the emitter when turned on and when turned off as described previously for field-effect transistors can be envisaged, for example.

What is claimed is:

1. A sampling phase detector comprising:
   a first sampling transistor (1) having:
      an input for a signal to be sampled at a frequency RF;
      an input (OUT1) for receiving a control signal;
      an output for supplying a first sampled signal as a function of the phase between the signal to be sampled and the control signal;
      a resistance between the input and the output less than $(0.1 \times 10^{-12} \times RF)^{-1}$ ohms when said first sampling transistor is turned on; and
   a second sampling transistor (2) having a resistance between the input and the output greater than 100 ohms when said second sampling transistor is turned off and having:
      an input to which the first sampled signal is applied;
      an input (OUT2B) for receiving a second control signal; and
      an output for providing a second sampled signal.

2. The detector according to claim 1, characterized in that:
   the sampling transistors are field-effect transistors;
   the drain of the first transistor is the input for the signal to be sampled;
   the gate of the first transistor is the input for said control signal;
   the source of the first transistor is the output for the sampled signal;
   the drain of the second transistor is the input for the first sampled signal;
   the gate of the second transistor is the input for the second control signal;
   the source of the second transistor is the output for the second sampled signal; and
   the resistance between the input and the output of the second transistor when it is turned off is greater than the resistance between the input and the output of the first transistor when it is turned off.

3. The detector according to claim 2, characterized in that:
   the source of the first transistor is shunted by a first capacitor (11); and
   the source of the second transistor is shunted by a second capacitor (12).

4. The detector according to claim 1, characterized in that it further comprises a control signal generator (4) for supplying pulses to the inputs for control signals of the first and second transistors.

5. The detector according to claim 4, characterized in that the control signal generator (4) is implemented monolithically with the transistors.

6. The detector according to claim 4, characterized in that the control signal generator has:
   an input for an AC reference signal; and
   an inverter circuit (5, 6) for connecting the AC reference signal input to the input for the control signals of the first or second transistor.

7. The detector according to claim 6, characterized in that the inverter circuit includes an SCFL gate.

8. The detector according to claim 6, characterized in that the inverter circuit comprises three or four inverter stages.

9. The detector according to claim 4, characterized in that the control signal generator supplies respective control signals (21, 22) in phase opposition to the first and second transistors.

10. A local oscillator including a phase detector according to claim 1.

11. A sampling phase detection method comprising the steps of:
    providing a first sampling transistor (1) having a resistance between its input and its output less than $(0.1 \times 10^{-12} \times RF)^{-1}$ ohms when said first sampling transistor is turned on;
    providing a second sampling transistor (2) having a resistance between its input and its output greater than 100 ohms when said second sampling transistor is turned off;
    sampling a signal to be sampled in the first sampling transistor; and
    sampling the sampled signal in the second sampling transistor.

12. The method according to claim 11, characterized in that it further comprises the step of:
    applying control pulses (21, 22) to the transistors to trigger the sampling steps.

13. The method according to claim 12, characterized in that the control pulses are in phase opposition.

14. The method according to claim 11, characterized in that it further comprises a step of smoothing the sampled signals.

* * * * *